United States Patent
Li (10) Patent No.: US 10,333,238 B2
(45) Date of Patent: Jun. 25, 2019

(54) SURFACE MOUNT CONTACT, ELECTRONIC DEVICE ASSEMBLY, AND TEST PROBE PIN TOOL

(71) Applicant: Telefonaktiebolaget LM Ericsson (publ), Stockholm (SE)

(72) Inventor: Peihua Li, Shanghai (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/749,810

(22) PCT Filed: Aug. 6, 2015

(86) PCT No.: PCT/CN2015/086239
§ 371 (c)(1),
(2) Date: Feb. 2, 2018

(87) PCT Pub. No.: WO2017/020295
PCT Pub. Date: Feb. 9, 2017

(65) Prior Publication Data
US 2018/0219311 A1 Aug. 2, 2018

(51) Int. Cl.
*H01R 4/02* (2006.01)
*H05K 3/34* (2006.01)
(Continued)

(52) U.S. Cl.
CPC ............ *H01R 12/57* (2013.01); *H01R 4/024* (2013.01); *H01R 4/025* (2013.01); *H01R 12/52* (2013.01); *H05K 3/341* (2013.01)

(58) Field of Classification Search
CPC ........ H01R 12/57; H01R 12/52; H01R 4/024; H01R 4/025; H05K 3/368; H05K 3/308; H05K 3/3426; H05K 3/341
(Continued)

(56) References Cited

U.S. PATENT DOCUMENTS 4,678,250 A * 7/1987 Romine ............... H01R 12/716
439/83
5,085,602 A * 2/1992 Bauman ................... H01R 4/02
439/874
(Continued)

FOREIGN PATENT DOCUMENTS

CN 2459793 11/2001
CN 1571149 A 1/2005
(Continued)

OTHER PUBLICATIONS

PCT Notification of Transmittal of the International Search Report and the Written Opinion of the International Searching Authority, or the Declaration for International application No. PCT/CN2015/086239—dated May 5, 2016.
(Continued)

*Primary Examiner* — Gary F Paumen
(74) *Attorney, Agent, or Firm* — Sage Patent Group (57) ABSTRACT

A surface mount contact (100) for coupling to an electronic device (200, 300), comprising: a conductive pin (10) having an elongated pin body (12), the pin body (12) comprising a first end (122) and a second end (124) opposing to the first end (122); and a heat re-flowable bonding member (20) coupled to the first end (122); wherein the pin body (12) is integrally provided with a support portion (14) in a region of the pin body (12) adjacent to the heat re-flowable bonding member (20). The cost and time of manufacture is reduced.

17 Claims, 5 Drawing Sheets

(51) Int. Cl.
*H01R 12/52* (2011.01)
*H01R 12/57* (2011.01)

(58) Field of Classification Search
USPC .................................. 439/83, 876, 75
See application file for complete search history.

(56) References Cited

U.S. PATENT DOCUMENTS

| | | | |
|---|---|---|---|
| 6,179,631 B1* | 1/2001 | Downes | H01R 43/0256 228/246 |
| 6,429,388 B1* | 8/2002 | Interrante | B23K 35/262 174/261 |
| 6,623,283 B1 | 9/2003 | Torigian et al. | |
| 6,700,079 B2 | 3/2004 | Bogursky et al. | |
| 7,537,498 B2 | 5/2009 | Cachina et al. | |
| 8,545,237 B2* | 10/2013 | Johnson | H01R 12/523 439/75 |
| 8,998,652 B2* | 4/2015 | Martineau | G06F 3/01 324/755.05 |
| 2006/0014443 A1* | 1/2006 | Roshardt | H01R 43/0235 439/876 |
| 2010/0122458 A1 | 5/2010 | Woods, Jr. et al. | |
| 2010/0252311 A1 | 10/2010 | Murphy | |
| 2011/0059633 A1* | 3/2011 | Chen | H01R 12/57 439/83 |

FOREIGN PATENT DOCUMENTS

| | | |
|---|---|---|
| CN | 201562783 U | 8/2010 |
| CN | 204167543 | 2/2015 |
| WO | 01 29929 A1 | 4/2001 |
| WO | 2015 090410 A1 | 6/2015 |

OTHER PUBLICATIONS

Partial Supplementary Euproean Search Report for Application No./Patent No. 15900069.4-1201 / 332452 PCT/CN2015086239—dated Jun. 26, 2018.
Extended European Search Report issued for Application No./Patent No. 15900069.4-1201 / 3332452 PCT/CN2015086239—dated Oct. 4, 2018.
First Chinese Office Action for Chinese Patent Application No. CN 201580082194.7 dated Mar. 4, 2019, 17 pages (including English translation).

* cited by examiner

SURFACE MOUNT CONTACT, ELECTRONIC DEVICE ASSEMBLY, AND TEST PROBE PIN TOOL

PRIORITY

This nonprovisional application is a U.S. National Stage Filing under 35 U.S.C. § 371 of International Patent Application Serial No. PCT/CN2015/086239 filed Aug. 6, 2015, and entitled "Surface Mount Contact, Electronic Device Assembly, And Test Probe Pin Tool."

TECHNICAL FIELD

The present disclosure generally relates to electronic parts and assemblies that utilize surface mount technology (SMT), and more particularly, to the surface mounting of printed circuit boards (PCB).

BACKGROUND

Solder ball contact pin is widely used in POL (point of load) DC/DC power regulator applications. A POL DC/DC regulator with the solder ball contact pin provides a SMT compatible solution for mounting a module for final assembly. The pin body (made by copper) provides a rigid, high conductivity connection to a power module (or PCB) and the solder ball onto the contact pin can provide co-planarity compensation when assembling the power module to a host board during the reflow or vapor phase process.

A typical solder ball contact pin includes a solder ball or sphere, an insulator which provides a positive location of the solder ball during the reflow process, and a copper alloy pin body to provide robust connection between the power module and the host board.

In the current existing solution, an insulator surrounding the pin body and adjacent to the solder ball is used as a solder ball contact structure. The insulator mentioned means solder insulator which could be made of an electrical isolated material like FR4 or resin (which is described in patent U.S. Pat. No. 6,700,079). Alternatively, an electrical conductive material as mentioned in U.S. Pat. No. 7,537,498 is provided to substitute for the insulator to provide a similar function during the reflow process.

Both above solutions include a discrete solder insulator. The assemble process for insulator is complex during the manufacturing, meanwhile due to the solder insulator, it's not good for a solder joint quality when mounting power modules to the host board by means of the solder ball onto the pin body.

Besides that, a test solution for high current solder ball contact POL (POL means Point of load, a DC/DC regulator) becomes a challenge. Usually a test probe pin will move from vertical direction and touch the solder ball. If an electrical current is very high, the test process will generate huge heat due to high contact resistance between the test probe pin and the solder ball. The solder ball can re-melt if the test current is high enough. This will lead to test failure of POL product.

High current POL is the trend for power module industry, but the current solder ball contact solution can't meet the requirement for high current POL manufacture and electrical test process.

SUMMARY

In view of the foregoing, an object of the present disclosure is to overcome or at least mitigate above shortcoming of the prior art solution for simplifying the solder ball pin assembly process.

Further, another object of the present disclosure is to provide a robust test solution for high current applications.

In accordance with one aspect of the present invention, it provides a surface mount contact for coupling to an electronic device, comprising:

a conductive pin having an elongated pin body, the pin body comprising a first end and a second end opposing to the first end; and a heat re-flowable bonding member coupled to the first end;

wherein the pin body is integrally provided with a support portion in a region of the pin body adjacent to the heat re-flowable bonding member.

In accordance with another aspect of the present invention, it provides an electronic device assembly, comprising:

a plurality of discrete surface mount contacts as described above;

a first electronic device having a plurality of conductive pads arranged in a predetermined pattern;

a second electronic device opposing and generally parallel with the first electronic device, and having a plurality of contact positions; and a plurality of conductive joints each formed by re-flow of the heat re-flowable bonding member attached to the first end of a corresponding pin body, each conductive joint bonding the first end of the corresponding pin body and a corresponding conductive pad and forming an electro-mechanical bond therebetween.

In accordance with a yet another aspect of the present invention, it provides a test probe pin tool adapted to test the surface mount contact as described above, comprising:

a test pin, having a head at one side thereof;

a socket, configured to house a part of the test pin therein; and a spring, configured to be disposed between the socket and the head of the test pin;

wherein the head has a centralized blind hole at its tip to accommodate the heat re-flowable bonding member therein during the testing, and the hole has an inner chamfered feature at its outermost end, complementary to a downwardly inclined surface on a shoulder of the pin body and contacting each other during the testing.

BRIEF DESCRIPTION OF THE DRAWINGS

These aspects and/or other aspects as well as advantages of the present invention will become obvious and readily understood from the description of the preferred embodiments of the present invention in conjunction with the accompanying drawings below, in which.

DETAILED DESCRIPTION OF EMBODIMENTS

In the discussion that follows, specific details of particular embodiments of the present techniques are set forth for purposes of explanation and not limitation. It will be appreciated by those skilled in the art that other embodiments may be employed apart from these specific details.

Furthermore, in some instances detailed descriptions of well-known methods, structures, and devices are omitted so as not to obscure the description with unnecessary detail.

Figure 1:
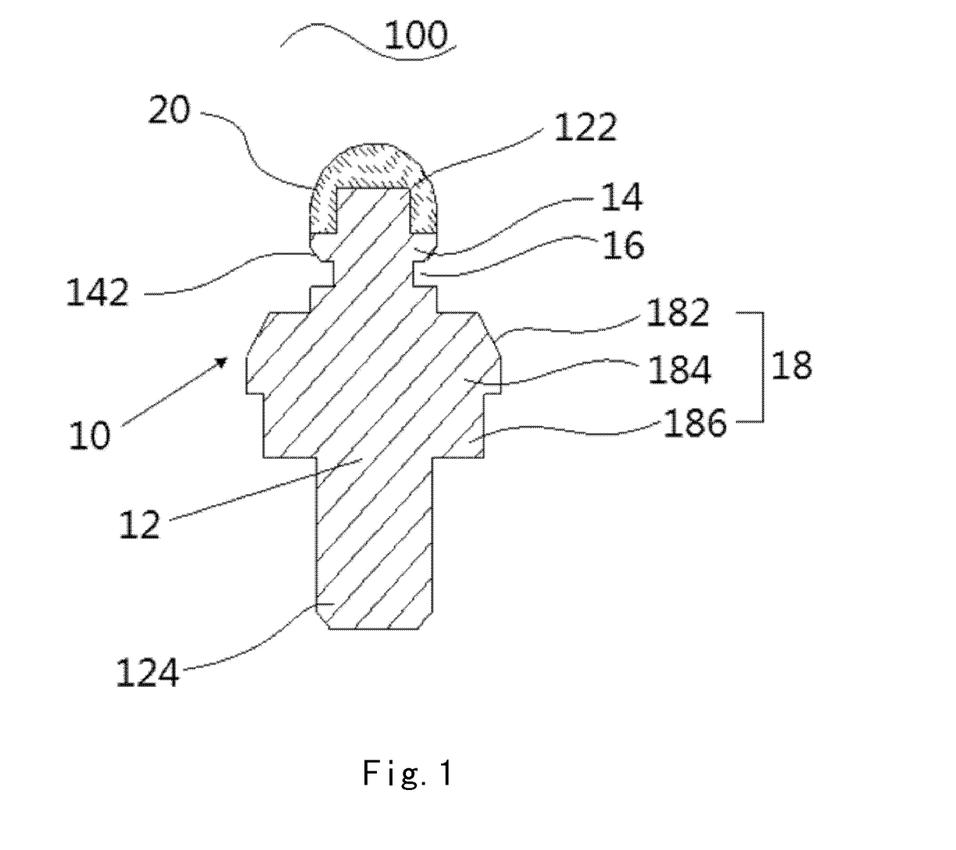
FIG. 1 is a schematic cross-sectional view showing a structure of a surface mount contact in accordance with an embodiment of the present invention.
Figure 3A:
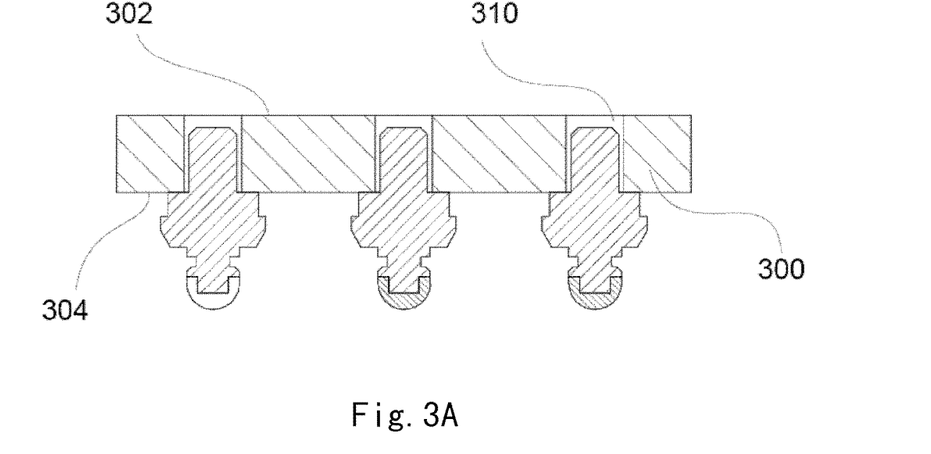
FIGS. 3A, 3B and 3C are cross-sectional views of an electronic device assembly, after the surface mount contact as shown in FIG. 1 is installed into a power module, before the surface mount contact is connected to a host board, and after it has been connected to the host board.
Figure 3B:
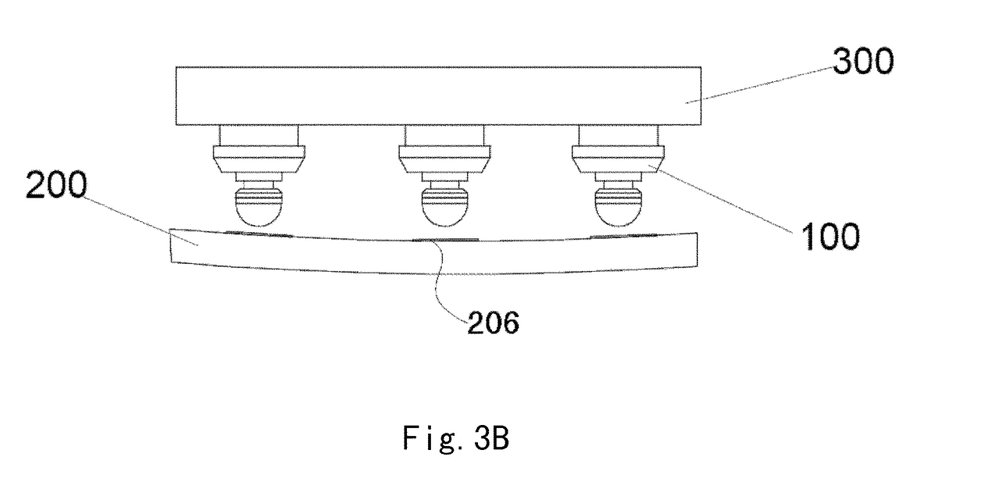
Figure 3C:
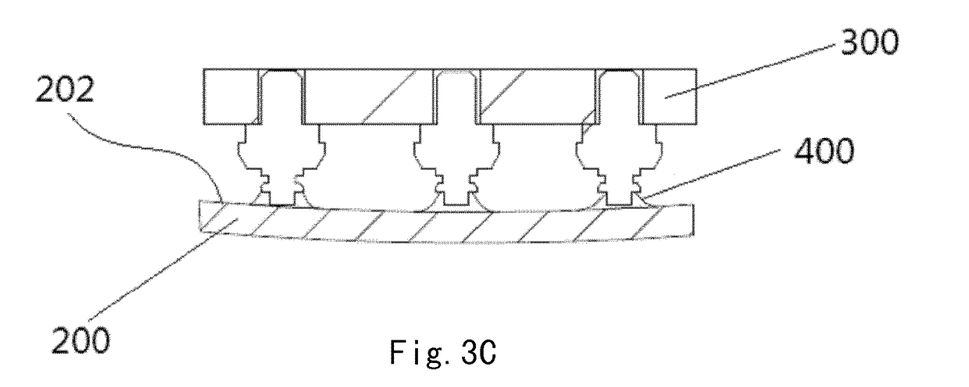

FIG. 1 illustrates a surface mount contact 100 according to an embodiment of the present invention, and for attachment to an electronic device, for example a planar circuit board (a host board) 200 or a power module board 300 (FIGS. 3A-3C). Specifically, the surface mount contact 100 includes a conductive pin 10, and a heat re-flowable bonding member 20. In one example, the conductive pin 10 has an elongated pin body 12, and the pin body 12 has a first end 122 and a second end 124 opposing to the first end 122. The pin body 12 is integrally provided with a support portion 14. The support portion 14 is located in a region of the pin body 12 adjacent to the heat reflowable bonding member 20.

It should be appreciated that although the figure shows the first end 122 being a small end and the second end 124 being a large end, this is not necessary, and the skilled person can make a selection depending on the actual condition.

In addition, although FIG. 1 shows the pin body 12 having a cross section in a ring shape, the present invention is not intended to limit to this. It should be appreciated that the person skilled in the art can select the cross sectional shape of the pin body 12, for example from the group consisting of a circle, a ring, a square, a triangle, and a rectangle. That is, the skilled person can choose any shape of the pin body, as actually required.

When the surface mount contact 100 is prepared for use, the material (e.g., solder) for forming the heat re-flowable bonding member 20 is coupled to pin body 12 by embedding or otherwise disposing the material around the first end 122 of the pin body 12. For example, the material can be preformed to assume a distinct shape, such as solder ball, or a solder sphere, and is then coupled to the first end 122 by dipping or pouring the material onto the first end 122, so that the material is securely held on the first end 122, as shown in FIG. 1.

Specifically, in one example, the heat re-flowable bonding member 20 is in the form of a solder ball (sometimes, will be called as the solder sphere). The first end 122 of the pin body 12 is embedded within the solder ball 20.

The heat re-flowable bonding member 20 at the first end 122 is bonded to a first electronic device (for example, a host board 200 as shown in FIG. 3C) and the second end 124 of the pin body 12 is connected to a second electronic device 300 (for example, a power module board as shown in FIG. 3A). The heat re-flowable bonding member 20 is configured to provide co-planarity compensation when assembling the second electronic device 300 to the first electronic device 200 during a reflow or vapor phase process.

As shown in FIG. 1, the support portion 14 extends radially from the pin body 12. In an example, the support portion 14 is in a shape of ring and centrally located on the pin body 12. In other words, the support portion 14 can be called as "support ring" for short below. Typically, the support portion 14 can have a same diameter as an outer diameter of the heat re-flowable bonding member 20. In this way, the support portion 14 can be configured to or used to support the heat re-flowable bonding member 20 and keep it in position, when mounting the heat re-flowable bonding member 20 to the conductive pin 10 in a reflow or vapor process.

Apparently, in the present invention, the support portion 14 is formed as an integral part of the pin body 12, and thus there is no need for a discrete solder insulator as described in the background of the present invention. In the embodiments of the present invention, the solder resistance feature (i.e., the support portion 14) is disposed and integrated into the pin body 12.

It is preferable to form the support portion 14 and the pin body 12 by the same one milling process. Since the pin body 12 and the support portion 14 typically are made from copper or cooper alloy, they can be manufactured during one milling process. The process of attaching the heat re-flowable bonding member 20 to the pin body 12 and the milling process of the pin body 12 will be described in detail with reference to FIGS. 2A-2D below.

Again referring to FIG. 1, the support portion 14 further has an upwardly inclined face 142 at a side toward the second end 124 with respect to the pin body 12. That is, the upwardly inclined face 142 faces the shoulder 18 (as discussed below) of the pin body 12. In one preferable example, an annular groove 16 is formed directly adjacent to the support portion 14 and opposing to the first end 122, which is adapted to perform a cleaning process for minimizing remained flux on the heat re-flowable bonding member 20. The cleaning process can be preformed for example with a suitable organic solvent, after installing the heat re-flowable bonding member 20 onto the first end 122 and/or connecting the host board 200 to the power module board 300 by means of reflowing the heat re-flowable bonding member 20.

As discussed below with respect to FIG. 2C to FIG. 2D, after the heat re-flowable bonding member 20 is installed on the first end 122, the tube-like socket 30 which is made by plastic material can protrude into the annular groove 16 by heat expansion. The upwardly inclined surface 142 is provided for facilitating the release process of the tube-like socket 30 as shown in FIG. 2D. With the upwardly inclined surface 142, the plastic residue of the tube-like socket 30 can be prevented in the release process.

For this end, the groove 16 is designed to have a minimum depth of 0.15 mm. But if the groove 16 is too deep, it would generate negative influence or performance for the electrical resistance of the pin body 12 would be highly increased. Taking into consideration of the above, the depth of 0.15-0.2 mm is preferable.

In principle, it is desirable to make a thickness for the support portion 14 as thin as possible. While considering the manufacturing process limitation, the thickness for the support portion 14 is preferable in a range of 0.2 mm to 0.3 mm.

In FIG. 1, it can be seen that the pin body 12 has a shoulder 18 protruding radially outward from the pin body, between the support portion 14 and the second end 124. The shoulder 18 has a downwardly inclined surface 182 with respect to a plane (a horizontal plane as shown in FIG. 1) perpendicular to an axially extending direction of the pin body 12 and at a side close to the first end 122, which is formed by chamfering the pin body 12.

In the illustrated example, the shoulder 18 is in the form of two annular step sections 184, 186. A first step section 184 thereof faces toward the first end 122 and has a first outer diameter, and a second step section 186 thereof has a second outer diameter, wherein the first outer diameter is larger than the second outer diameter and in turn the second outer diameter is larger than an outer diameter of the pin body. The downwardly inclined surface 182 is disposed at an upper portion of the first step section 184. The downwardly inclined surface 182 has an angle of 55-65° with respect to a plane perpendicular to a longwise direction of the pin body 12. In one specific example, the inclined angle is 60° with respect to the horizontal direction as shown in FIG. 1.

In the embodiment of the present invention, a discrete solder insulator is not needed, due to the solder resistance feature (i.e., the support ring) disposed in the cooper pin body. Therefore, it simplifies the solder ball pin assemble process. Compare with the solder insulator solution, the present invention can provide better solder joint quality when mounting the power modules to the host board.

A thin support-ring geometry (i.e., the support ring 14) is designed to hold and keep the solder ball in position, when mounting the solder ball 20 onto the first end 122 of the pin body 12 at a reflow or vapor phase process. The thin support-ring geometry feature in the first end 122 (i.e., the small end area as shown) of the pin body 12 is the key parameter for the surface mount contact 100 in accordance with the embodiment of the present invention.

During the reflow process to mount the solder ball 20 onto the first end 122, when the solder ball 20 re-melts, since the support ring 14 is provided with the annular groove 16, the temperature along the outside of the support ring 14 will be slightly lower than a central position of the solder ball 20, which would generate resistance for the solder wetting out. Thus, the solder ball 20 is kept in position during the reflow process.

Figure 2A:
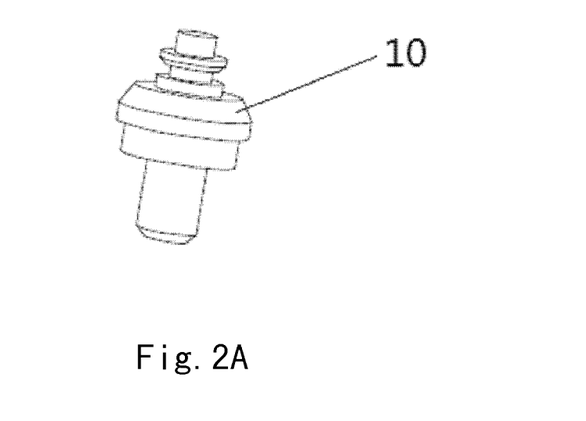
FIGS. 2A, 2B, 2C and 2D are flowcharts showing a manufacturing process of the surface mount contact as shown in FIG. 1.
Figure 2B:
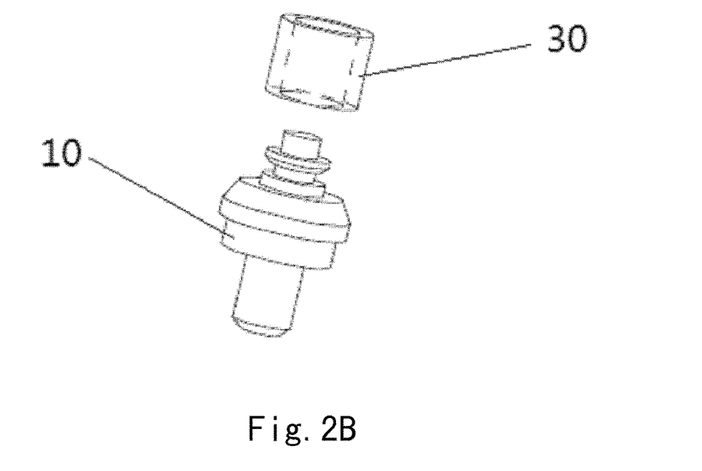
Figure 2C:
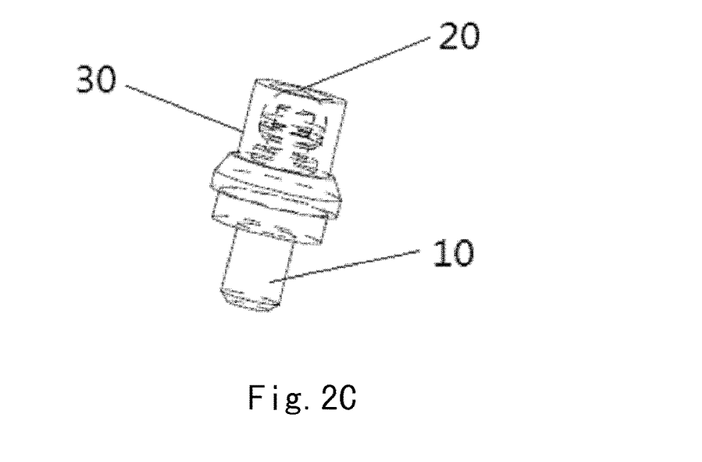
Figure 2D:
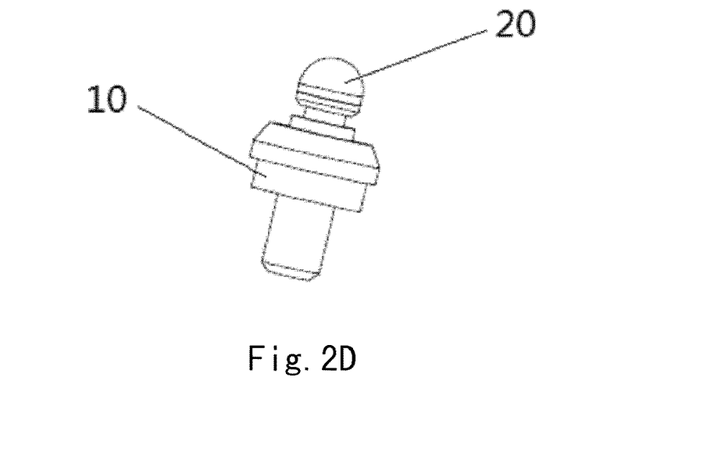

FIGS. 2A-2D illustrate a whole process of manufacturing the surface mount contact 100 as shown in FIG. 1. In FIG. 2A, the conductive pin 10 is produced by a milling process. As discussed above, the support portion 14 is integrated into the pin body 12 of the conductive pin 10 during the same milling process. After then, the pin body 12 is plated sequentially with a nickel layer having a thickness in a range of 1-3 μm and a gold layer having a thickness no less than 0.1 μm. In this example, the pin body is made of CuTe.

In FIG. 2B, a tube like socket 30 is mounted onto the shoulder 18, so as to accommodate the support portion 14 therein. The tube like socket 30 is a solder insulated tube like tooling, which is used for the solder ball bonding process.

In FIG. 2C, a solder ball 20 with a surface coated flux is positioned in the tube like socket 30. After a heat process, the solder ball 20 will be melted and bonded to the first end 122 of the pin body 12. In this example, the solder ball 20 has a solder form of 96.5 Sn, 3.0 Ag, and 0.5 Cu on a mass basis.

As shown in FIG. 2C, after the heat re-flowable bonding member 20 is installed on the first end 122, the tube-like socket 30 which is made by plastic material can protrude into the annular groove 16 by heat expansion. The upwardly inclined surface 142 as shown in FIG. 1 is provided for facilitating the release process of the tube-like socket 30 as shown in FIG. 2D. With the upwardly inclined surface 142, the plastic residue of the tube-like socket 30 can be prevented in the release process.

It should be noted that during the heat process, the flux might enter the annular groove 16. Therefore, a cleaning process is needed typically, as shown in FIG. 2D. After removing the tube like socket 30, a qualified cleaning process is performed to minimize the remained flux in the annular groove 16. After that, the qualified surface mount contact 100 is completed. Please be noted that the solder flux cleaning process is also important to keep the solder sphere from wetting out during the reflow process.

FIGS. 3A-3C illustrates cross-sectional views of an electronic device assembly, after the surface mount contact as shown in FIG. 1 is installed into a power module 300, before the surface mount contact 100 is connected to a host board 200, and after it has been connected to the host board 200.

Specifically, the electronic device assembly includes a plurality of discrete surface mount contacts 100 as described above, a first electronic device (for example a host board) 200, a second electronic device (for example a power module) 300, and a plurality of conductive joints 400. The host board 200 has a plurality of conductive pads (not shown) arranged in a predetermined pattern. The power module 300 is disposed opposing and generally parallel with the host board 200 and has a plurality of contact positions (i.e., vias 310 discussed below).

In FIG. 3A, it shows out three surface mount contacts 100 used during the assembling process. The second end 124 of the pin body 12 of each surface mount contact 100 is firstly inserted into a corresponding via 310 in the power module board 300. During the insertion, it is adapted to perform the coplanarity compensation of the power module board 300. The shoulder 18 of each pin body 12 restricts a longitudinal position of the pin body 12 relative to the power module board 300, that is, the maximum longitudinal displacement of the pin body is limited by the second step section 186 of the shoulder 18.

The via 310 is formed therethrough for receiving the surface mount contact 100, and is complementary in shape to the shape of the second end 124 of the pin body 12, so that the second end 124 is easily received within the via 310. Preferably, there is a slight gap or space between the second end 124 and a wall defining the via 310 so that a coupling material (not shown), such as solder, is received therein around the second end 124 (the larger end of the pin 10) to produce a secure electrically conductive connection between the pin 10 and the power module board 300.

Preferably, the thickness of the power module board 300 is designed such that the second end 124 of the pin body 12 does not or only slightly protrudes beyond the upper surface 302 of the power module board 300, when the contact 100 is securely connected to the power module board 300 during a specific given application. Of course, the second end 124 can extend a greater distance beyond the upper surface 302 of the power module board 300 in some certain applications.

The shoulder 18 servers as a locating member since it limits the degree of travel of the pin 10 within the via 310 of the power module board 300 by being positioned adjacent a bottom surface 304 of the power module board 300 as shown in FIG. 3A. In other words, the shoulder 18 acts as a stop by abutting the bottom surface 304 of the power module board 300 and therefore, when the contact 100 is securely attached to the power module board 300, the shoulder 18 sits flush against the bottom surface 304 of the power module board 300.

FIG. 3B shows out the assembling state of the electronic device assembly before attaching the surface mount contact 100 to the host board 200.

The contact 100 can act as a connector by electrically connecting the power module board 300 to the host board 200. In the illustrated embodiment, the host board 200 is electrically connected to the power module board 300. Instead of being of the type that has vias 310 formed therethrough, the host board 200 is of the type that has at least one and preferably a plurality of conductive pads 206 formed on an upper surface 202 of the host board 200 as shown in FIG. 3C, and for electrical connection to the pin 10 of the contact 100. More specifically, the pin 10 is electrically connected to the conductive pad 206 by means of reflowing the heat reflowable bonding member 20.

The first end 122 is firstly positioned relative to the conductive pad 206 so that the heat re-flowable bonding member 20 is disposed near or adjacent the conductive pad 206. Solder flux or solder paste is needed to be screening printed on conductive pad 206 before installing the heat reflowable bonding member 20 onto the conductive pad 206. Heat is applied to the host board 200 by the conventional techniques (e.g., hot air, oven, etc.) so as to cause the material of the bonding member 20 to reflow as illustrated in FIG. 3C. As the material of the bonding member 20 reflows, the material contacts and flows across the conductive pad 206 and when the material cools down, a secure soldered connection is formed between the conductive pad 206 and the first end 122 of the pin body 12. Since the connection between the second end 124 and the power module board 300 is of an electrically conductive type, the pin 10 serves to electrically connect the power module board 300 to the host board 200.

Referring back to FIG. 3C, a plurality of conductive joints 400 (i.e., solder joints) are formed during this process of reflow of the solder ball 20 attached to the first end 122 of the corresponding pin body 12. Each conductive joint 400 bonds the first end 122 of the corresponding pin body 12 and the corresponding conductive pad 206 on the host board 200, thereby forming an electro-mechanical bond therebetween.

Figure 4:
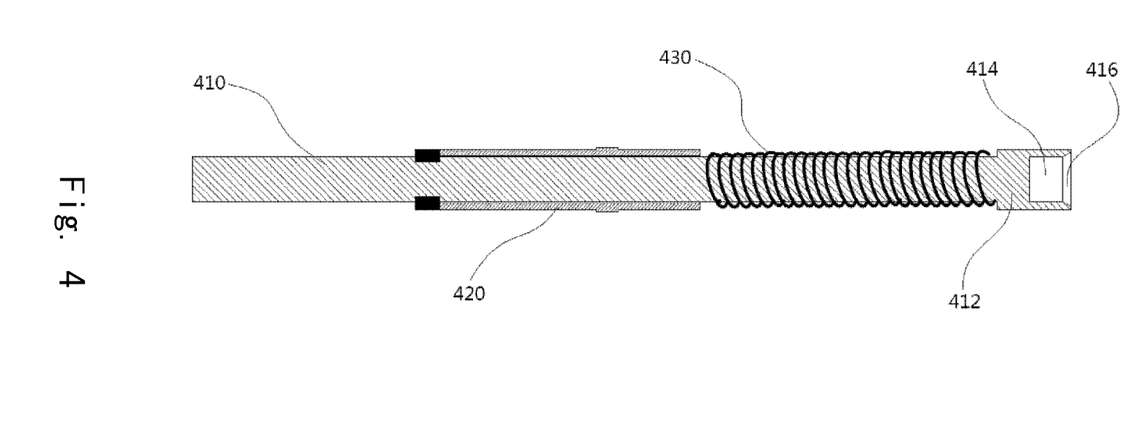
FIG. 4 is a cross-sectional view of a test probe pin tool in accordance with one embodiment of the present invention.
Figure 5:
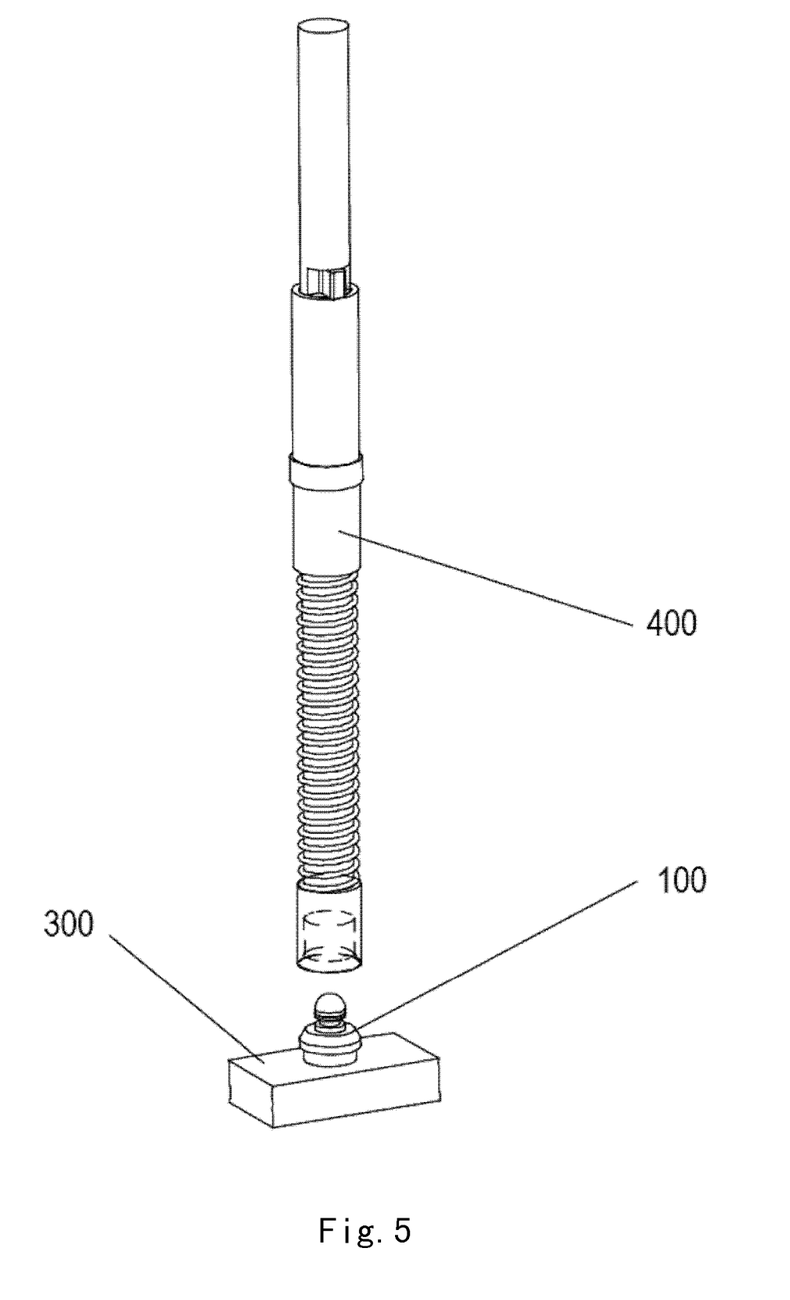
FIG. 5 is a schematic view of the test probe pin tool during a test.

FIGS. 4 and 5 show out the test probe pin tool 400 in accordance with one embodiment of the present invention and during a test, respectively. The test probe pin tool 400 is adapted to test the surface mount contact 100 as described above. Please be noted that the test is performed after installing the surface mount contact 100 into the power module board 300.

In this example, the test probe pin tool 400 includes a test pin 410, a socket 420, and a spring 430. The test pin 410 has a head 412 at one side thereof (i.e., the right side of FIG. 4). The socket 420 is configured to house a part of the test pin 410 therein and the spring 430, configured to be disposed between the socket 420 and the head 412 of the test pin 410.

Specifically, the head 412 has a centralized blind hole 414 at its tip to accommodate the heat re-flowable bonding member 20 therein during the testing, and the hole 414 has an inner chamfered feature 416 at its outermost end, complementary to a downwardly inclined surface 182 on a shoulder 18 of the pin body 12 and contacting each other during the testing. The shoulder 18 of the pin body 12 is chamfered to form the downwardly inclined surface 182, which can increase contact area with the test probe pin tool 400. The test probe pin tool 400 is specially designed to fit the solder ball contact pin 100. The test probe pin tool 400 at its tip has a centralized blind hole 414 to prevent the direct touch with the solder ball, and the inner chamber of the head 412 is chamfered in the same angle with the shoulder 18 of the pin body 12, that is, the downwardly inclined surface 182 is complementary to the inner chamfered feature 416, and they contact each other during the testing.

Since the inner chamfered feature 416 closely contacts the downwardly inclined surface 182 with a relatively larger contact area during the testing, and they are made of good conductor materials, there is less electrical resistance between them and no huge heat generated therebetween. It is suitable for testing the high current solder ball contact 100. In addition, because the solder ball 20 is fully housed within the blind hole 414 during the testing without contacting the bind hole 412, it will be protected effectively. In this way, the embodiment of the present invention provides a robust test solution for high current applications.

As shown in FIG. 5, it illustrates one of surface mount contacts 100 installed on one electronic device (for example the power module board) 300, and thus the corresponding test probe pin tool 400 is used for the test. Normally, it is desirable to test each surface mount contact 100 with the pin tool 400 at the one time. Of course, the present invention is not intended to limit this, and the skilled person can select the specific testing means as actually required.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

What is claimed is:

1. A surface mount contact for coupling to an electronic device, comprising:
 a conductive pin having an elongated pin body, the pin body comprising a first end and a second end opposing to the first; and
 a heat re-flowable bonding member coupled to the first end;
 wherein the pin body is integrally provided with a support portion in a region of the pin body adjacent to the heat re-flowable bonding member;
 wherein the support portion extends radially from the pin body, and the support portion is in a shape of a ring and centrally located on the pin body;
 wherein the support portion further has an upwardly inclined surface at a side toward the second end with respect to the pin body; wherein the upwardly inclined surface at a side towards the second end facilitates a release process of a tube-like socket during the coupling of the heat re-flowable bonding member to the first end;
 wherein the pin body has a shoulder, protruding radially outward from the pin body, between the support portion and the second end of the pin body;
 wherein the shoulder at a side close to the first end has a downwardly inclined surface with respect to a plane perpendicular to an axially extending direction of the pin body, which is formed by chamfering the pin body; and wherein the downwardly inclined surface formed on the shoulder of the pin body increases a contact area with a test probe pin tool.

2. The surface mount contact of claim 1, wherein the support portion has a same diameter as an outer diameter of the heat re-flowable bonding member.

3. The surface mount contact of claim 1, wherein the support portion is configured to support the heat re-flowable bonding member and keep it in position, when mounting the heat re-flowable bonding member in a reflow or vapor process.

4. The surface mount contact of claim 1, wherein the support portion and the pin body are formed by the same one milling process.

5. The surface mount contact of claim 1, wherein the support portion and the pin body are made from copper, or copper alloy.

6. The surface mount contact of claim 1, wherein the pin body has a cross sectional shape selected from the group consisting of a circle, a ring, a square, a triangle, and a rectangle.

7. The surface mount contact of claim 1, wherein the heat re-flowable bonding member is in the form of a solder ball, with the first end of the pin body being embedded therein.

8. The surface mount contact of claim 1, wherein the shoulder is in the form of two annular step sections, a first step section of which faces toward the first end and has a first outer diameter, and a second step section of which has a second outer diameter, wherein the first outer diameter is larger than the second outer diameter and in turn the second outer diameter is larger than an outer diameter of the pin body; and the downwardly inclined surface is disposed at an upper portion of the first step section.

9. The surface mount contact of claim 1, wherein the downwardly inclined surface has an angle of 55-65° with respect to a plane perpendicular to the pin body.

10. The surface mount contact of claim 1, wherein an annular groove is formed directly adjacent to the support portion and opposing to the first end, which are adapted to perform a cleaning process for minimizing remained flux on the heat re-flowable bonding member.

11. The surface mount contact of claim 10, wherein the support portion has a thickness in a range of 0.2 mm to 0.3 mm, the annular groove has a depth in a range of 0.15 mm to 0.2 mm.

12. The surface mount contact of claim 1, wherein the pin body is made of CuTe, and then plated sequentially with a Nickel layer having a thickness in a range of 1-3 μm and a gold layer having a thickness no less than 0.1 μm; the heat re-flowable bonding member has a solder form of 96.5 Sn, 3.0 Ag, and 0.5 Cu on a mass basis.

13. The surface mount contact of claim 1, wherein the heat re-flowable bonding member at the first end is bonded to a first electronic device and the second end of the pin body is connected to a second electronic device; the heat re-flowable bonding member is configured to provide co-planarity compensation when assembling the second electronic device to the first electronic device during a reflow or vapor phase process.

14. An electronic device assembly, comprising:
a plurality of discrete surface mount contacts according to claim 1;
a first electronic device having a plurality of conductive pads arranged in a predetermined pattern;
a second electronic device opposing and generally parallel with the first electronic device, and having a plurality of contact positions; and
a plurality of conductive joints each formed by re-flow of the heat re-flowable bonding member attached to the first end of a corresponding pin body, each conductive joint bonding the first end of the corresponding pin body and a corresponding conductive pad and forming an electro-mechanical bond there between.

15. The electronic device assembly of claim 14, wherein the second ends of the pin bodies are inserted into corresponding vias in the second electronic device and a shoulder of each pin body restricts a longitudinal position of the pin body relative to the second electronic device.

16. The electronic device assembly of claim 14, wherein the first electronic device is a host board, and the second electronic device is a power module board.

17. The test probe pin tool adapted to test the surface mount contact according to claim 1, comprising:
a test pin, having a head at one side thereof;
a socket, configured to house a part of the test pin therein; and
a spring, configured to be disposed between the socket and the head of the test pin;
wherein the head has a centralized blind hole at its tip to accommodate the heat re-flowable bonding member therein during the testing, and the hole has an inner chamfered feature at its outermost end, complementary to the downwardly inclined surface on a shoulder of the pin body and contacting each other during the testing.

* * * * *